United States Patent
Matsumoto et al.

(10) Patent No.: US 9,560,758 B2
(45) Date of Patent: Jan. 31, 2017

(54) UNIFORM IMPEDANCE CIRCUIT BOARD

(71) Applicant: CANON KABUSHIKI KAISHA, Tokyo (JP)

(72) Inventors: Shoji Matsumoto, Yokohama (JP); Seiji Hayashi, Yokohama (JP); Takuya Kondo, Chigasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 265 days.

(21) Appl. No.: 14/250,211

(22) Filed: Apr. 10, 2014

(65) Prior Publication Data
US 2014/0305688 A1 Oct. 16, 2014

(30) Foreign Application Priority Data

Apr. 15, 2013 (JP) .................................. 2013-084540
Mar. 3, 2014 (JP) .................................. 2014-040405

(51) Int. Cl.
*H05K 1/11* (2006.01)
*H05K 1/02* (2006.01)

(52) U.S. Cl.
CPC ............. *H05K 1/115* (2013.01); *H05K 1/0251* (2013.01); *H05K 2201/096* (2013.01); *H05K 2201/0979* (2013.01); *H05K 2201/10545* (2013.01)

(58) Field of Classification Search
None
See application file for complete search history.

(56) References Cited

U.S. PATENT DOCUMENTS

| | | | | | |
|---|---|---|---|---|---|
| 3,568,000 A | * | 3/1971 | D'Aboville | ............. | H01P 3/088 333/238 |
| 4,368,503 A | * | 1/1983 | Kurosawa | .............. | H05K 3/429 174/263 |
| 5,293,502 A | * | 3/1994 | Kimura | ................. | H01L 21/486 174/250 |
| 5,363,280 A | * | 11/1994 | Chobot | ................ | H05K 1/0201 174/266 |
| 5,774,340 A | * | 6/1998 | Chang | ..................... | H01L 23/50 174/255 |
| 5,876,842 A | * | 3/1999 | Duffy | ................ | H01L 23/49827 174/250 |

(Continued)

FOREIGN PATENT DOCUMENTS

JP   2007-123742 A   5/2007

*Primary Examiner* — Jeremy C Norris
*Assistant Examiner* — Muhammed Azam
(74) *Attorney, Agent, or Firm* — Canon U.S.A., Inc. IP Division

(57) ABSTRACT

A printed wiring board includes a first conductive layer, a second conductive layer arranged at a gap with respective to the first conductive layer, a third conductive layer, a first via conductor and a second via conductor, and a third signal wiring pattern. A first signal wiring pattern is arranged on the first conductive layer, a second signal wiring pattern is arranged on the second conductive layer, and a third signal wiring pattern that is arranged on the third conductive layer. The third conductive layer is arranged between the first conductive layer and the second conductive layer via an insulating layer. The first via conductor and the second via conductor, which are arranged to be mutually adjacent, connect the first signal wiring pattern to the second signal wiring pattern. The third signal wiring pattern connects the first via conductor to the second via conductor.

17 Claims, 8 Drawing Sheets

(56) References Cited

U.S. PATENT DOCUMENTS

| | | | | |
|---|---|---|---|---|
| 6,034,864 A * | 3/2000 | Naito | H01G 4/30 | 361/306.1 |
| 6,072,690 A * | 6/2000 | Farooq | H01G 4/30 | 257/E23.067 |
| 6,198,168 B1 * | 3/2001 | Geusic | H01L 23/48 | 257/676 |
| 6,229,095 B1 * | 5/2001 | Kobayashi | H05K 1/0216 | 174/255 |
| 6,236,572 B1 * | 5/2001 | Teshome | H05K 1/0219 | 174/261 |
| 6,372,999 B1 * | 4/2002 | Bjorndahl | H05K 3/103 | 174/262 |
| 6,549,395 B1 * | 4/2003 | Naito | H01G 4/30 | 361/306.1 |
| 6,577,013 B1 * | 6/2003 | Glenn | H01L 23/3114 | 257/618 |
| 6,653,574 B2 * | 11/2003 | Tsai | H01L 23/49822 | 174/258 |
| 8,618,632 B2 * | 12/2013 | Kawashima | H01L 23/50 | 257/532 |
| 8,841,561 B1 * | 9/2014 | Jiang | H05K 1/0219 | 174/262 |
| 8,853,552 B2 * | 10/2014 | Takenaka | H01L 23/49822 | 174/255 |
| 9,082,785 B2 * | 7/2015 | Ishida | H01L 23/66 | |
| 2003/0136582 A1 * | 7/2003 | Liu | H05K 1/113 | 174/262 |
| 2004/0196122 A1 * | 10/2004 | Fisher | H01P 1/047 | 333/246 |
| 2004/0212971 A1 * | 10/2004 | Iguchi | H05K 1/0222 | 361/780 |
| 2005/0039950 A1 * | 2/2005 | Chan | H01L 25/0652 | 174/262 |
| 2005/0257957 A1 * | 11/2005 | Vasoya | H05K 3/445 | 174/260 |
| 2006/0158280 A1 * | 7/2006 | Jow | H01L 23/66 | 333/33 |
| 2006/0232949 A1 * | 10/2006 | Osaka | H05K 1/0236 | 361/788 |
| 2007/0284727 A1 * | 12/2007 | Liao | H05K 1/111 | 257/700 |
| 2008/0184175 A1 * | 7/2008 | Su | G06F 17/5036 | 716/115 |
| 2009/0049414 A1 * | 2/2009 | Mutnury | G06F 17/5068 | 716/132 |
| 2010/0032195 A1 * | 2/2010 | Hayashi | H01L 23/49827 | 174/260 |
| 2010/0097172 A1 * | 4/2010 | Tonouchi | H01C 1/14 | 338/204 |
| 2011/0024177 A1 * | 2/2011 | Wong | H05K 1/116 | 174/262 |
| 2011/0147068 A1 * | 6/2011 | Cahill | G06F 17/5077 | 174/266 |
| 2011/0226516 A1 * | 9/2011 | Takeda | H05K 1/0231 | 174/260 |
| 2012/0013360 A1 * | 1/2012 | Oh | G01R 3/00 | 324/763.01 |
| 2012/0125677 A1 * | 5/2012 | Choi | H05K 1/0224 | 174/262 |

* cited by examiner

UNIFORM IMPEDANCE CIRCUIT BOARD

BACKGROUND OF THE INVENTION

Field of the Invention

The present invention relates to a printed wiring board including a transmission line and also relates to a printed circuit board including the printed wiring board.

Description of the Related Art

In a printed wiring board, terminals of a plurality of mounted semiconductor integrated circuits are connected to each other by a transmission line to carry out a signal transmission. In the signal transmission, a waveform of the signal transmitted from the semiconductor integrated circuit is preferably transmitted to the receiving-side semiconductor integrated circuit without being distorted while the signal is transmitted on the transmission line. For that reason, a characteristic impedance of the transmission line is preferably set to be uniform as much as possible to avoid a reflection corresponding to a cause of the waveform distortion.

Meanwhile, because of demands for a miniaturization of electronic equipment in recent years, a multilayer printed wiring board including a plurality of conductive layers on which a signal wiring pattern used for the signal transmission is arranged is being used for the printed wiring board. In a case where the signal transmission between the semiconductor integrated circuits mounted on different layers on front and back sides is carried out in the multilayer printed wiring board, wiring is to be laid out by switching the conductive layers on which the signal wiring pattern is arranged by a via conductor.

Since such via conductor is a discontinuous structure with respect to the signal wiring pattern, the setting of the uniform characteristic impedance is obstructed. Up to now, an operating frequency is low, and a time during which the signal passes through the via is short with respect to a rising time of the signal, so that an influence thereof can be ignored.

However, along with realization of a higher speed of a circuit operation in recent years, nonuniformity of the characteristic impedance caused by this via conductor becomes difficult to ignore.

As a method of solving this, a method of setting uniform characteristic impedance by connecting front and back signal wiring patterns to each other by two adjacent via conductors is proposed (see Japanese Patent Laid-Open No. 2007-123742). Whereas the characteristic impedance of the signal wiring pattern is approximately 40[Ω] to 60[Ω], the via conductor is approximately 120[Ω] in terms of the characteristic impedance which is higher than the signal wiring pattern, and these characteristic impedances are not uniform.

According to Japanese Patent Laid-Open No. 2007-123742, the connection is realized by the via conductors where the characteristic impedance is effectively approximately halved by arranging the via conductors at the characteristic impedance of 120[Ω] in parallel. For this reason, it is possible to set the characteristic impedances of the two via conductors to be close to the characteristic impedance of the signal wiring pattern.

The characteristic impedance of the transmission line preferably has a low value of a difference (variation width) between a maximum value and a minimum value. For example, the variation width of the characteristic impedance of the transmission line is preferably suppressed to be 20[%] or lower (or more preferably, 10[%] or lower).

However, according to Japanese Patent Laid-Open No. 2007-123742, the characteristic impedance at the part corresponding to the two via conductors is set to be close to the characteristic impedance of the signal wiring pattern, but the variation width of the characteristic impedance of the transmission line still exists, and this variation width is preferably decreased further.

In view of the above, the present invention provides a printed wiring board and a printed circuit board with which it is possible to further set the characteristic impedance of the transmission line to be uniform.

SUMMARY OF THE INVENTION

According to an aspect of the present invention, a printed wiring board includes a first conductive layer on which a first signal wiring pattern is arranged, a second conductive layer on which a second signal wiring pattern is arranged and which is arranged at a gap with respective to the first conductive layer, a third conductive layer arranged between the first conductive layer and the second conductive layer via an insulating layer, a first via conductor and a second via conductor, which are arranged to be mutually adjacent, connecting the first signal wiring pattern to the second signal wiring pattern, and a third signal wiring pattern that is arranged on the third conductive layer and connects the first via conductor to the second via conductor.

Further features of the present invention will become apparent from the following description of exemplary embodiments with reference to the attached drawings.

DESCRIPTION OF THE EMBODIMENTS

Hereinafter, exemplary embodiments for carrying out the present invention will be described in detail with reference to the drawings.

First Exemplary Embodiment

Figure 1:
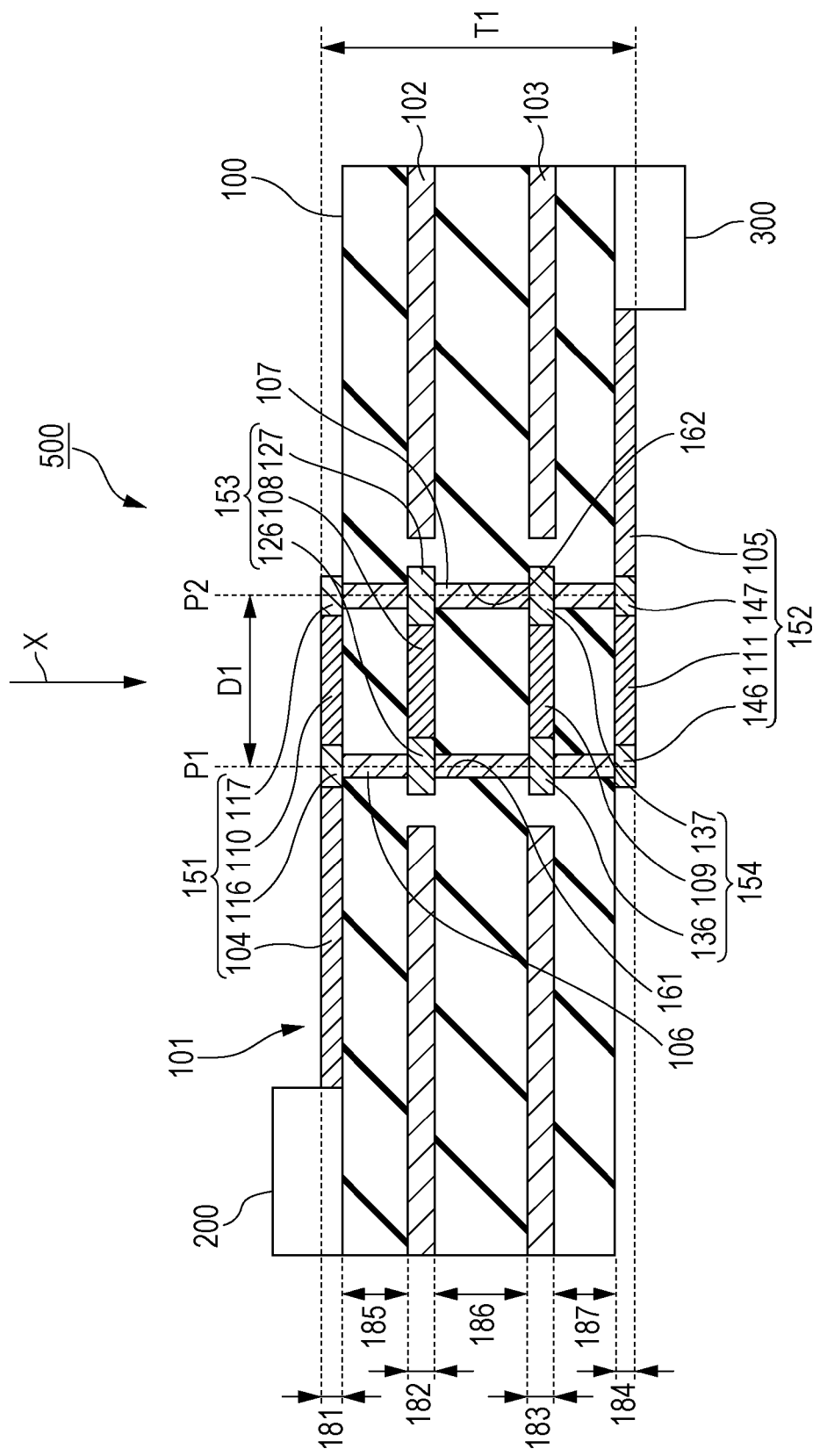
FIG. 1 is a cross sectional view of a printed circuit board according to a first exemplary embodiment.

FIG. 1 is a cross sectional view of a printed circuit board according to a first exemplary embodiment of the present invention. FIG. 1 illustrates a cross section of the printed circuit board along a face perpendicular to a plane of a printed wiring board. A printed circuit board 500 includes a printed wiring board 100, a transmitting circuit 200 mounted to the printed wiring board 100, and a receiving circuit 300 mounted to the printed wiring board 100.

The printed wiring board 100 is constituted by a substrate including four conductive layers according to the present first exemplary embodiment, and four conductive layers 181, 182, 183, and 184 are laminated and formed via insulating layers 185, 186, and 187. The conductive layers 181, 182, 183, and 184 are sequentially mutually arranged at intervals, and the insulating layers 185, 186, and 187 are provided between the conductive layers 181, 182, 183, and 184. Insulating materials (dielectrics) are arranged for the respective insulating layers 185, 186, and 187.

According to the present first exemplary embodiment, among a pair of surface layers, the conductive layer 181 corresponding to a first conductive layer is one surface layer (first surface layer), and the conductive layer 184 corresponding to a second conductive layer is the other surface layer (second surface layer) on a side opposite to the one surface layer. The plurality of conductive layers 182 and 183 as third conductive layers corresponding to inner layers are arranged between the conductive layers 181 and 184 via the insulating layers 185, 186, and 187. Specifically, the insulating layer 185 is arranged between the conductive layer 181 and the conductive layer 182, the insulating layer 186 is arranged between the conductive layer 182 and the conductive layer 183, and the insulating layer 187 is arranged between the conductive layer 183 and the conductive layer 184. Solder resist layers that are not illustrated in the drawing for protecting the conductor patterns may be provided on front faces of the conductive layers 181 and 184 corresponding to the surface layers.

The transmitting circuit 200 and the receiving circuit 300 are constructed, for example, by a semiconductor package. The transmitting circuit 200 is mounted to the conductive layer 181, and the receiving circuit 300 is mounted to the conductive layer 184.

The printed wiring board 100 is provided with a transmission line 101 for transmitting a signal. A terminal of the transmitting circuit 200 is connected to one terminal of the transmission line 101, and a signal terminal of the receiving circuit 300 is connected to the other terminal of the transmission line 101. The printed wiring board 100 also includes a ground plane 102 corresponding to a conductor pattern having a plane-like shape which is arranged on the conductive layer 182 and a power supply plane 103 corresponding to a conductor pattern having a plane-like shape which is arranged on the conductive layer 183.

A ground terminal of the transmitting circuit 200 and a ground terminal of the receiving circuit 300 are connected to the ground plane 102 through vias or the like not illustrated in the drawing. A power supply terminal of the transmitting circuit 200 and a power supply terminal of the receiving circuit 300 are connected to the power supply plane 103 through vias or the like not illustrated in the drawing.

The transmitting circuit 200 transmits a digital signal at a predetermined transmission speed to the transmission line 101 as a signal, and the receiving circuit 300 receives the digital signal transmitted from the transmitting circuit 200 via the transmission line 101.

The transmission line 101 includes a signal wiring pattern 151 corresponding to a first signal wiring pattern arranged on the conductive layer 181 and a signal wiring pattern 152 corresponding to a second signal wiring pattern arranged on the conductive layer 184. The signal wiring patterns 151 and 152 are formed of a conductor pattern. The transmitting circuit 200 is connected to the signal wiring pattern 151, and the receiving circuit 300 is connected to the signal wiring pattern 152.

The transmission line 101 includes a via conductor 106 corresponding to a first via conductor that connects the signal wiring pattern 151 to the signal wiring pattern 152, and the via conductor 106 is formed in a via hole 161 corresponding to a first via hole formed in the printed wiring board 100. The transmission line 101 also includes a via conductor 107 corresponding to a second via conductor that connects the signal wiring pattern 151 to the signal wiring pattern 152, and the via conductor 107 is formed in a via hole 162 corresponding to a second via hole formed in the printed wiring board 100. The via holes 161 and 162, that is, the via conductors 106 and 107 are arranged so as to be adjacent to each other at an interval. According to the present exemplary embodiment, the via holes 161 and 162 are through-holes, and the via conductors 106 and 107 are plated in the through-holes.

The transmission line 101 further includes a signal wiring pattern 153 corresponding to a third signal wiring pattern that connects the via conductor 106 to the via conductor 107, and the signal wiring pattern 153 is arranged on the conductive layer 182. Furthermore, the transmission line 101 includes a signal wiring pattern 154 corresponding to the third signal wiring pattern that connects the via conductor 106 to the via conductor 107, and the signal wiring pattern 154 is arranged on the conductive layer 183.

In this manner, the transmission line 101 includes the plurality of third signal wiring patterns corresponding to the respective third conductive layers. According to the present first exemplary embodiment, the transmission line 101 includes the two third signal wiring patterns corresponding to the two conductive layers 182 and 183. That is, the transmission line 101 includes the signal wiring patterns 153 and 154 as the plurality of third signal wiring patterns.

Hereinafter, a principle for suppressing impedance mismatching will be described. First, a characteristic impedance $Z_{via}$ of a single via conductor is determined by the following expression (1) from an inductance component $L_{via}$ of the via conductor and a capacitance component $C_{via}$.

$$Z_{via} = \sqrt{(L_{via}/C_{via})} \qquad \text{Expression (1)}$$

According to the present exemplary embodiment, the via conductors 106 and 107 are arranged in parallel. According to this, the characteristic impedance at the part corresponding to the via conductors 106 and 107 in the transmission line 101 is approximately halved. However, when the via conductors 106 and 107 are just arranged in parallel, the characteristic impedance at the part corresponding to the via conductors 106 and 107 is high with respect to the signal wiring patterns 151 and 152.

According to the present exemplary embodiment, the via conductors 106 and 107 are connected to each other by the signal wiring patterns 153 and 154. According to this, the capacitance component $C_{via}$ is increased because of capacitative coupling between the signal wiring patterns 151 to 154. Therefore, the characteristic impedance $Z_{via}$ at the part corresponding to the via conductors 106 and 107 is reduced, and a characteristic impedance variation in the transmission line 101 is decreased.

Figure 2A:
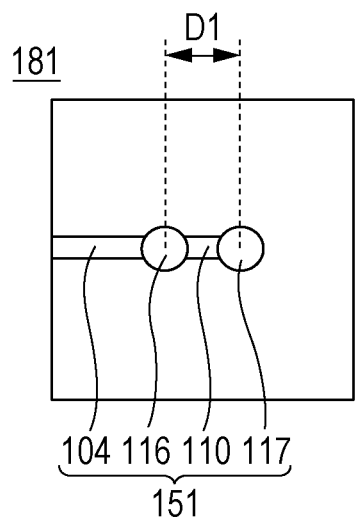
FIGS. 2A to 2D are plan views of respective conductive layers of a printed wiring board according to the first exemplary embodiment.
Figure 2B:
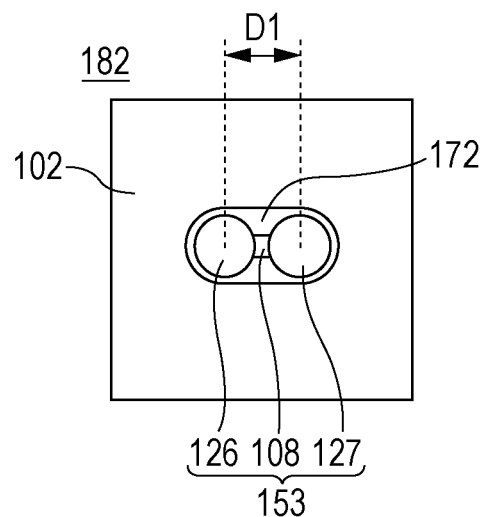
Figure 2C:
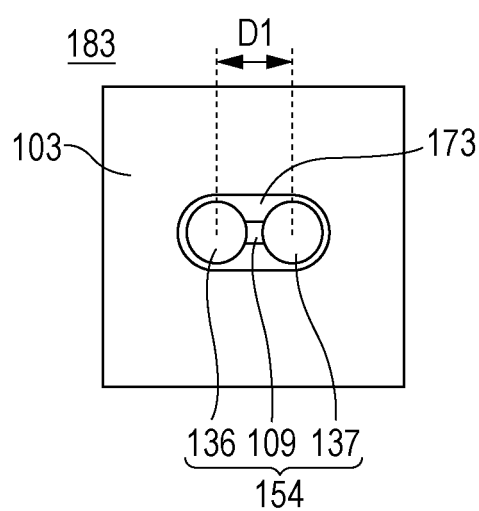
Figure 2D:
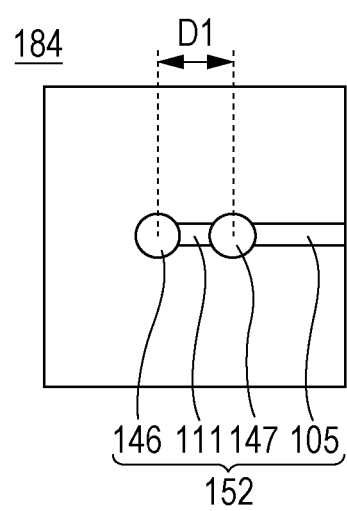

FIG. 2A is a plan view of the conductive layer 181 of the printed wiring board 100 as seen from an arrow X-direction in FIG. 1. FIG. 2B is a plan view of the conductive layer 182 of the printed wiring board 100 as seen from the arrow X-direction in FIG. 1. FIG. 2C is a plan view of the conductive layer 183 of the printed wiring board 100 as seen from the arrow X-direction in FIG. 1. FIG. 2D is a plan view of the conductive layer 184 of the printed wiring board 100 as seen from the arrow X-direction in FIG. 1.

As illustrated in FIG. 2A, the signal wiring pattern 151 includes a via pad 116 corresponding to a first via pad connected to the via conductor 106 and a via pad 117 corresponding to a second via pad connected to the via conductor 107. The signal wiring pattern 151 also includes a connecting conductor pattern 110 corresponding to a first connecting conductor pattern that connects the via pad 116 to the via pad 117 and a wiring pattern 104 that connects the transmitting circuit 200 to the via pad 116.

As illustrated in FIG. 2D, the signal wiring pattern 152 includes a via pad 146 corresponding to a third via pad connected to the via conductor 106 and a via pad 147 corresponding to a fourth via pad connected to the via conductor 107. The signal wiring pattern 152 also includes a connecting conductor pattern 111 corresponding to a second connecting conductor pattern that connects the via pad 116 to the via pad 117 and a wiring pattern 105 that connects the receiving circuit 300 to the via pad 147.

As illustrated in FIG. 2B, the signal wiring pattern 153 includes a via pad 126 corresponding to a fifth via pad connected to the via conductor 106 and a via pad 127 corresponding to a sixth via pad connected to the via conductor 107. The signal wiring pattern 153 also includes a connecting conductor pattern 108 corresponding to a third connecting conductor pattern that connects the via pad 126 to the via pad 127.

As illustrated in FIG. 2C, the signal wiring pattern 154 includes a via pad 136 corresponding to the fifth via pad connected to the via conductor 106 and a via pad 137 corresponding to a sixth via pad connected to the via conductor 107. The signal wiring pattern 154 also includes a connecting conductor pattern 109 corresponding to the third connecting conductor pattern that connects the via pad 136 to the via pad 137.

The connecting conductor patterns 108 to 111 are arranged on a same line in a plan view (as seen from the arrow X-direction perpendicular to a mounting surface of the printed wiring board 100). According to this, the capacitance component among the signal wiring patterns 151 to 154 is increased, and it is possible to more effectively reduce the character impedance in the vicinity of the via conductors 106 and 107.

According to the present exemplary embodiment, the connecting conductor patterns 108 to 111 are arranged on a straight line that connects a center P1 of the via conductor 106 to a center P2 of the via conductor 107 as seen from the arrow X-direction. Therefore, the connecting conductor patterns 108 to 111 take a shortest route, and an occupied area of the wirings is small.

The via conductors 106 and 107, the via pads 126 and 127, and a clearance hole 172 surrounding the connecting conductor pattern 108 are formed on the ground plane 102 on the conductive layer 182. In addition, the via conductors 106 and 107, the via pads 136 and 137, and a clearance hole 173 surrounding the connecting conductor pattern 109 are formed on the power supply plane 103 on the conductive layer 183.

Simulation Example 1

Hereinafter, specific numeral values are set and analyzed in the printed circuit board 500 described according to the first exemplary embodiment, and an effect thereof will be described. Sizes of the respective parts of the printed wiring board 100 used in the simulation will be illustrated.

A thickness of the conductive layers 181 and 184 is set as 0.043 [mm]. A thickness of the conductive layers 182 and 183 is set as 0.035 [mm]. A thickness of the insulating layers 185 and 187 is set as 0.1 [mm]. A thickness of the insulating layer 186 is set as 1.3 [mm]. A total thickness T1 of the printed wiring board 100 is 1.656 [mm].

A width of the conductor patterns 104, 105, 108, 109, 110, and 111 is set as 0.125 [mm]. A diameter of the via conductors 106 and 107 (outer diameter) is set as 0.3 [mm]. A diameter of the via pads 116, 117, 146, and 147 is set as 0.6 [mm]. A diameter of the via pads 126, 127, 136, and 137 is set as 0.8 [mm]. A pitch D1 between the via conductors 106 and 107 is set as 1.0 [mm]. A length in a longitudinal direction of the clearance holes 172 and 173 is set as 2.0 [mm], and a length in a lateral direction is set as 1.0 [mm]. A smallest gap between the via pads 126 and 127 and the ground plane 102 is set as 0.1 [mm]. A smallest gap between the via pads 136 and 137 and the power supply plane 103 is set as 0.1 [mm].

Since the diameter of the via pads 116 and 117 is 0.6 [mm] and the pitch D1 between the via conductors 106 and 107 is 1.0 [mm], a shortest length of the connecting conductor pattern 110 is 0.4 [mm]. Since the diameter of the via pads 146 and 147 is 0.6 [mm] and the pitch D1 between the via conductors 106 and 107 is 1.0 [mm], a shortest length of the connecting conductor pattern 111 is 0.4 [mm]. Since the diameter of the via pads 126 and 127 is 0.8 [mm] and the pitch D1 between the via conductors 106 and 107 is 1.0 [mm], a shortest length of the connecting conductor pattern 108 is 0.2 [mm]. Since the diameter of the via pads 136 and 137 is 0.8 [mm], and the pitch D1 between the via conductors 106 and 107 is 1.0 [mm], a shortest length of the connecting conductor pattern 109 is 0.2 [mm]. A relative dielectric constant of the insulating layer is set as 4.3.

A simulation is carried out for measuring a reflectance by a TDR (Time Domain Reflectomery) method of inputting a step pulse having an amplitude $V_{in}$ and a rising time of 35 [ps] from an end part on the transmitting circuit 200 side of the wiring pattern 104. Subsequently, the characteristic impedance of the transmission line 101 is calculated. When a voltage at a measurement point (end part on the transmitting circuit 200 side of the wiring pattern 104) is set as $V_r$ and an output impedance of the pulse signal is set as 50[Ω], the characteristic impedance Z of the transmission line 101 can be calculated by the following expression (2).

$$Z=(1+(V_r-V_{in})/V_{in})/(1-(V_r-V_{in})/V_{in})/50 \quad \text{Expression (2)}$$

Figure 3A:
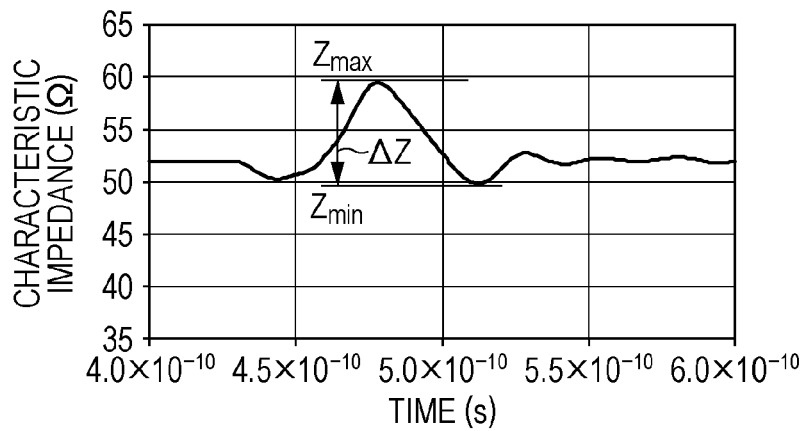
FIGS. 3A to 3D are graphic representations of simulation results in the printed circuit board according to the first exemplary embodiment.

A result of the TDR simulation in the above-described conditions will be illustrated in FIG. 3A. The vertical axis represents the characteristic impedance of the transmission line 101, and the horizontal axis represents time. A central value of the characteristic impedance of the transmission line 101 is 52[Ω]. The maximum value $Z_{max}$ of the characteristic impedance is 59.5[Ω], and the minimum value $Z_{min}$ is 49.8[Ω], so that the difference ΔZ is 9.7 [Ω].

Therefore, the variation width ΔZ of the characteristic impedance Z at the part corresponding to the via conductors 106 and 107 falls into 10.4[Ω] within an allowable value of 20 [%] for the variation width with respect to the characteristic impedance at 52[Ω] of the transmission line 101.

Simulation Example 2

According to the present simulation example 2, a simulation result in a case where the wiring width of the connecting conductor patterns 108, 109, 110, and 111 in the printed circuit board 500 is set as 0.3 [mm] will be illustrated. To elaborate, the simulation result in a case where the wiring width of the connecting conductor patterns 108, 109, 110, and 111 is set as the diameter of the via conductors 106 and 107 will be illustrated. It is noted that the sizes of the respective parts other than these are the same as the sizes in the simulation example 1.

Figure 3B:
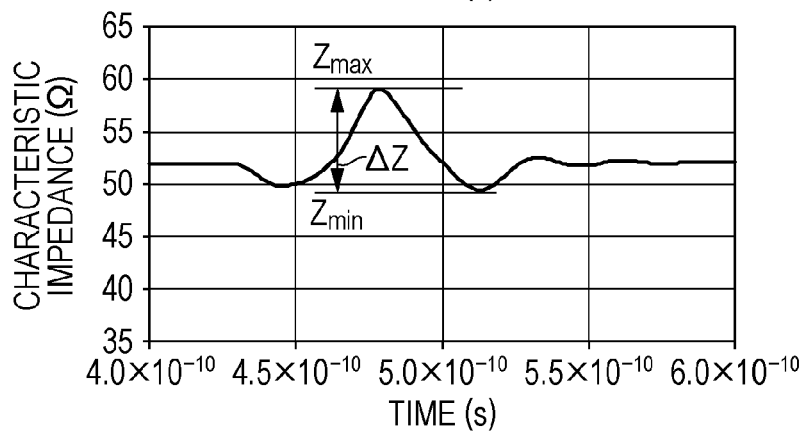

A TDR simulation result is illustrated in FIG. 3B. The vertical axis represents the characteristic impedance of the transmission line 101, and the horizontal axis represents time.

The capacitance component between the connecting conductor patterns 108 and 109 can be increased by setting the wiring width at 0.125 [mm] of the wiring patterns 104 and 105 to be thicker than the connecting conductor patterns 108 and 109. It is also possible to increase the capacitance component between the connecting conductor patterns 110 and 108 and the capacitance component between the connecting conductor patterns 109 and 111.

In addition, the connecting conductor patterns 110 and 111 are set to be thicker than the wiring width at 0.125 [mm] of the wiring patterns 104 and 105. According to this, the capacitance component between the connecting conductor patterns 110 and 108 and the capacitance component between the connecting conductor patterns 109 and 111 by the capacitive coupling can further be increased.

In this manner, it is possible to increase the capacitance component $C_{via}$ of the characteristic impedance at the part in the vicinity of the via conductors 106 and 107 by setting the connecting conductor patterns 108, 109, 110, and 111 to be thicker. Therefore, the increase in the characteristic impedance at the part in the vicinity of the via conductors 106 and 107 can be suppressed.

According to the present simulation result, the maximum value $Z_{max}$ of the characteristic impedance is 59.0 [Ω], and the minimum value $Z_{min}$ is 49.4[Ω], so that the difference ΔZ is 9.6[Ω]. Therefore, the variation width ΔZ of the characteristic impedance at the part corresponding to the via conductors 106 and 107 falls into 10.4[Ω] within the allowable value of 20 [%] for the variation width with respect to the characteristic impedance at 52[Ω] of the transmission line 101.

Simulation Example 3

According to the present simulation example 3, a simulation result in a case where the wiring width of the connecting conductor patterns 108 and 109 is set as 0.8 [mm] and the wiring width of the connecting conductor patterns 110 and 111 is set as 0.6 [mm] in the printed circuit board 500 is illustrated. That is, a case will be described in which the wiring width of the connecting conductor patterns 108 and 109 is set as the diameter of the via pads 126, 127, 136, and 137 and the wiring width of the connecting conductor patterns 110 and 111 is set as the diameter of the via pads 116, 117, 146, and 147. It is noted that the sizes of the respective parts other than these are the same as the sizes in the simulation example 1.

Figure 3C:
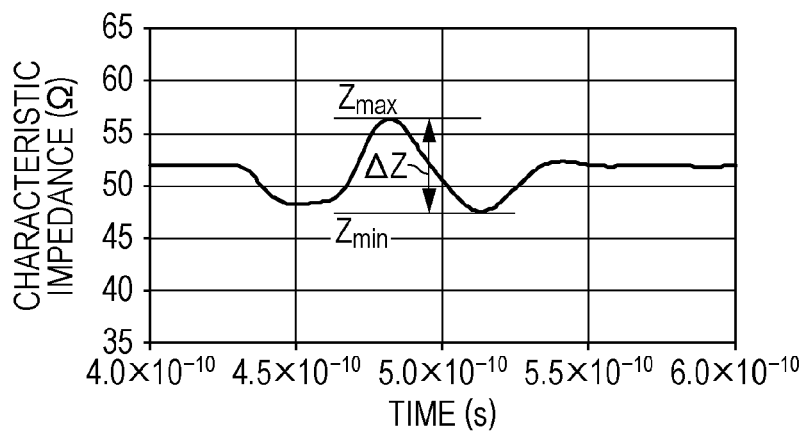

A TDR simulation result is illustrated in FIG. 3C. The vertical axis represents the characteristic impedance of the transmission line 101, and the horizontal axis represents time.

The maximum value $Z_{max}$ of the characteristic impedance of the transmission line 101 is 56.3[Ω], and the minimum value $Z_{min}$ is 47.6[Ω], so that the difference ΔZ is 8.7[Ω]. Therefore, the variation width ΔZ of the characteristic impedance at the part corresponding to the via conductors 106 and 107 falls into 10.4[Ω] within the allowable value of 20 [%] for the variation width with respect to the characteristic impedance at 50[Ω] of the transmission line 101. The maximum value $Z_{max}$ of the characteristic impedance and the minimum value $Z_{min}$ also fall into the characteristic impedance at 52 [Ω]±10 [%] (57.2 to 46.8[Ω]) of the transmission line 101.

That is, while the wiring width of the connecting conductor patterns 108 and 109 is set to be higher than or equal to the diameter of the via conductors 106 and 107 and also lower than or equal to the diameter of the via pads 126, 127, 136, and 137, the variation width ΔZ of the characteristic impedance of the transmission line 101 is further decreased. Furthermore, while the wiring width of the connecting conductor patterns 110 and 111 is set to be higher than or equal to the diameter of the via conductors 106 and 107 and also lower than or equal to the diameter of the via pads 116, 117, 146, and 147, the variation width ΔZ of the characteristic impedance of the transmission line 101 is further decreased.

Simulation Example 4

Figure 3D:
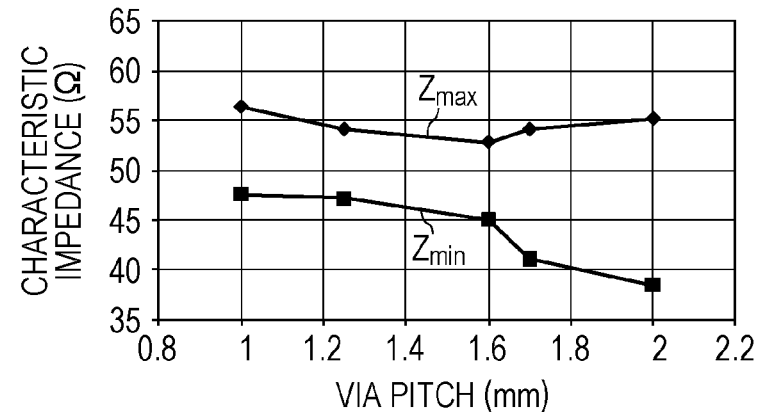

Here, a relationship between the characteristic impedance at the part corresponding to the via conductors 106 and 107 and the pitch D1 between the via conductors 106 and 107. In the mode represented in the simulation example 3, the maximum value $Z_{max}$ of the characteristic impedance and the minimum value $Z_{min}$ in a case where the via pitch D1 is changed are derived herein. FIG. 3D illustrates a relationship between a characteristic impedance maximum value 201, a minimum value 202, and the pitch D1 between the via conductors 106 and 107. The vertical axis represents the characteristic impedance, and the horizontal axis represents the via pitch. When the via pitch D1 exceeds the thickness T1 of the printed wiring board 100, that is, the thickness T1 at 1.656 [mm] from the conductive layer 181 to the conductive layer 184, the difference ΔZ between the maximum value $Z_{max}$ and the minimum value $Z_{min}$ is abruptly increased.

From this result, the pitch D1 between the via conductor 106 and the via conductor 107 is preferably lower than or equal to the thickness T1 from the conductive layer 181 to the conductive layer 184, so that it is possible to effectively decrease the variation width ΔZ.

Here, a reason why the impedance variation width ΔZ is higher when the via pitch D1 exceeds the thickness T1 will be described. When the step pulse signal input to the wiring pattern 104 reaches the via pad 116, the step pulse signal propagates by being branched to the via conductor 106 and the connecting conductor pattern 110. At this time, if the via pitch D1 exceeds the thickness T1 of the printed wiring board 100, the signal branched to the connecting conductor pattern 110 at a time when the signal propagating on the via conductor 106 reaches the via pad 146 does not yet reach the via pad 117.

After this, the signal that has passed through the via conductor 106 propagates to the connecting conductor pattern 111 via the via pad 146, the route on which the signal propagates corresponds to the connecting conductor patterns 108, 109, 110, and 111 in parallel. Since this configuration is the parallel wirings using only the signal wirings basically having the characteristic impedance lower than the via conductors, the characteristic impedance is decreased too much. The maximum value is also increased by swinging-back because of the abrupt decrease of the characteristic impedance. For that reason, to suppress the variation width ΔZ of the characteristic impedance, the via pitch D1 is preferably lower than or equal to the thickness T1 of the printed wiring board 100.

Actual Equipment Verification Method

A TDR oscilloscope is used to measure the characteristic impedance of the transmission line 101 in the actual printed wiring board 100. The step pulse having the amplitude $V_{in}$ (for example, 400 [mV]) and the rising time of 35 [ps] is input from the end part of the transmitting circuit 200 side of the wiring pattern 104 via a probe. When a characteristic impedance mismatching point exists, the signal is reflected at the characteristic impedance mismatching point, and the signal returns to the probe to which the signal is input. Thus, the signal observed at the probe is added with a reflector voltage. The characteristic impedance of the transmission line 101 can be calculated from this observed voltage. When a voltage at a measurement point is set as $V_r$, and an output impedance of the pulse signal is set as 50[Ω], the characteristic impedance Z of the transmission line 101 can be calculated by the above-described expression (2).

Comparison Examples

Simulation results in a case where one via conductor is used and a case where two via conductors are used without the third signal wiring pattern will be described as comparison examples.

Figure 7:
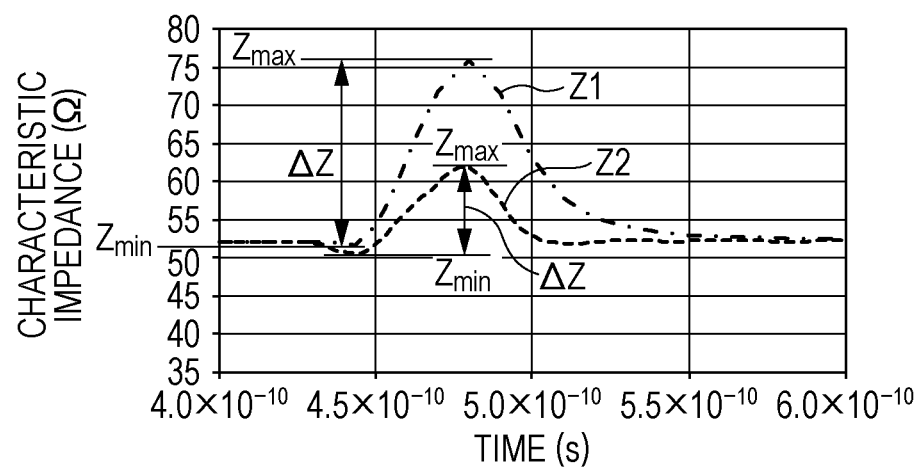
FIG. 7 is a graphic representation of characteristic impedances of transmission signals according to a comparison example.

FIG. 7 illustrates the characteristic impedances of the transmission signals according to comparison examples. It is noted that the sizes of the respective parts of the printed wiring board are similar to those in the simulation example 1. A characteristic impedance Z1 where one via is used is improved to a characteristic impedance Z2 by using two vias. However, the variation width ΔZ of the characteristic impedance Z2 where the two vias are used is 11.6[Ω] and is higher than that of the present exemplary embodiment. The variation width ΔZ does not fall into 10.4 [Ω] within the desired range with respect to the central value at 52[Ω] of the characteristic impedance of the transmission line.

In contrast to this, according to the present first exemplary embodiment, since the two via conductors 106 and 107 are mutually connected by the signal wiring patterns 153 and 154, the capacitance component in the vicinity of the via conductors 106 and 107 is increased. Therefore, the maximum value of the characteristic impedance in the vicinity of the via conductors 106 and 107 is decreased. According to this, the characteristic impedance of the transmission line 101 is further set to be uniform, and the characteristic impedance mismatching at the part of the via conductors 106 and 107 in the transmission line 101 is suppressed.

Second Exemplary Embodiment

Figure 4:
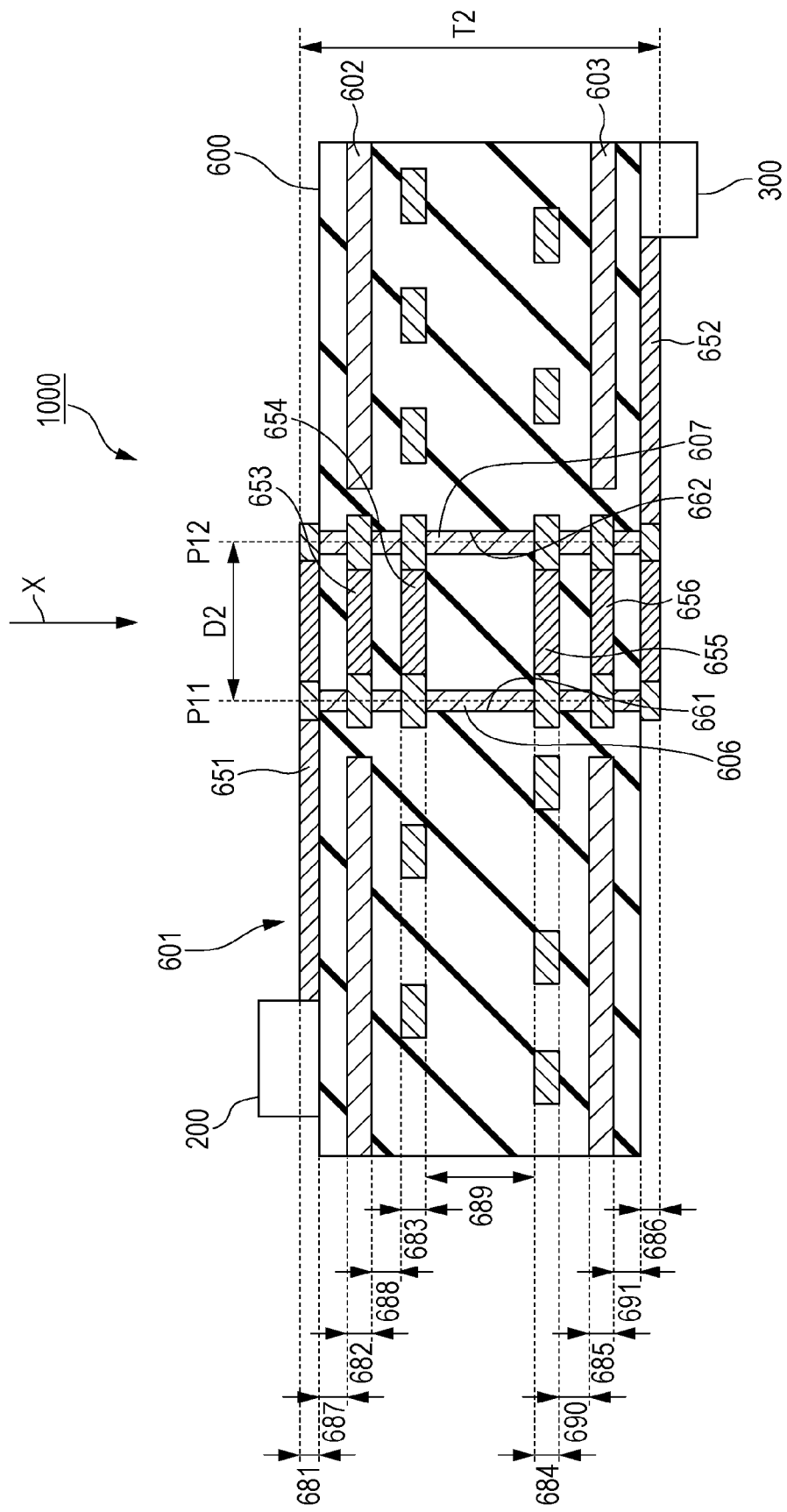
FIG. 4 is a cross sectional view of a printed circuit board according to a second exemplary embodiment.

Next, a printed circuit board according to a second exemplary embodiment of the present invention will be described. FIG. 4 is a cross sectional view of the printed circuit board according to the second exemplary embodiment of the present invention. In FIG. 4, a cross section of the printed circuit board along a face perpendicular to a plane of the printed wiring board is illustrated. A printed circuit board 1000 includes a printed wiring board 600, the transmitting circuit 200 mounted to the printed wiring board 600, and the receiving circuit 300 mounted to the printed wiring board 600.

According to the present second exemplary embodiment, the printed wiring board 600 is a substrate including six conductive layers. Six conductive layers 681, 682, 683, 684, 685, and 686 are laminated and formed via insulating layers 687, 688, 689, 690, and 691. The conductive layers 681 to 686 are sequentially mutually arranged at intervals, and the insulating layers 687 to 691 are arranged between these conductive layers. Insulating materials (dielectrics) are arranged for the respective insulating layers 687 to 691.

According to the present second exemplary embodiment, among a pair of surface layers, the conductive layer 681 corresponding to a first conductive layer is one surface layer (first surface layer), and the conductive layer 686 corresponding to a second conductive layer is the other surface layer (second surface layer) on a side opposite to the one surface layer. The plurality of conductive layers 682 to 685 as third conductive layers corresponding to inner layers are arranged between the pair of conductive layers 681 and 686 via the insulating layers 687 to 691. Specifically, the insulating layer 687 is arranged between the conductive layer 681 and the conductive layer 682. The insulating layer 688 is arranged between the conductive layer 682 and the conductive layer 683. The insulating layer 689 is arranged between the conductive layer 683 and the conductive layer 684. In addition, the insulating layer 690 is arranged between the conductive layer 684 and the conductive layer 685, and the insulating layer 691 is arranged between the conductive layer 685 and the conductive layer 686. Solder resist layers that are not illustrated in the drawing for protecting the conductor patterns may be provided on front faces of the conductive layers 681 and 686 corresponding to the surface layers.

The transmitting circuit 200 and the receiving circuit 300 are constituted, for example, by a semiconductor package. The transmitting circuit 200 is mounted to the conductive layer 681, and the receiving circuit 300 is mounted to the conductive layer 686.

The printed wiring board 600 includes a transmission line 601 that transmits a signal. The signal terminal of the transmitting circuit 200 is connected to the transmission line 601, and the signal terminal of the receiving circuit 300 is connected to the other terminal of the transmission line 601. The printed wiring board 600 also includes a ground plane 602 corresponding to a plane-like conductor pattern arranged on the conductive layer 682 and a power supply plane 603 corresponding to a plane-like conductor pattern arranged on the conductive layer 685.

The ground terminal of the transmitting circuit 200 and the ground terminal of the receiving circuit 300 are connected to the ground plane 602 through a via or the like that is not illustrated in the drawing. The power supply terminal of the transmitting circuit 200 and the power supply terminal of the receiving circuit 300 are connected to the power supply plane 603 through a via or the like that is not illustrated in the drawing.

The transmitting circuit 200 transmits a digital signal at a predetermined transmission speed to the transmission line 601 as a signal, and the receiving circuit 300 receives the digital signal transmitted from the transmitting circuit 200 via the transmission line 601.

The transmission line 601 includes a signal wiring pattern 651 corresponding to a first signal wiring pattern arranged on the conductive layer 681 and a signal wiring pattern 652 corresponding to a second signal wiring pattern arranged on the conductive layer 686. The signal wiring patterns 651 and 652 are formed of conductor patterns. The transmitting circuit 200 is connected to the signal wiring pattern 651, and the receiving circuit 300 is connected to the signal wiring pattern 652.

The transmission line 601 includes a via conductor 606 corresponding to a first via conductor that is formed in a via hole 661 corresponding to a first via hole formed in the printed wiring board 600 and connects the signal wiring pattern 651 to the signal wiring pattern 652. The transmission line 601 includes a via conductor 607 that is formed in a via hole 662 corresponding to a second via conductor formed in the printed wiring board 600 and connects the signal wiring pattern 651 to the signal wiring pattern 652. The via holes 661 and 662, that is, the via conductors 606 and 607 are arranged so as to be adjacent to each other at an interval. According to the present exemplary embodiment, the via holes 661 and 662 are through-holes, and the via conductors 606 and 607 are plated through-holes formed in the through-holes.

The transmission line 601 also includes a signal wiring pattern 653 corresponding to a third signal wiring pattern that is arranged on the conductive layer 682 and connects the via conductor 606 to the via conductor 607. The transmission line 601 also includes a signal wiring pattern 654 corresponding to the third signal wiring pattern that is arranged on the conductive layer 683 and connects the via conductor 606 to the via conductor 607. The transmission line 601 also includes a signal wiring pattern 655 corresponding to the third signal wiring pattern that is arranged on the conductive layer 684 and connects the via conductor 606 to the via conductor 607. Furthermore, the transmission line 601 includes a signal wiring pattern 656 corresponding to the third signal wiring pattern that is arranged on the conductive layer 685 and connects the via conductor 606 to the via conductor 607.

In this manner, the transmission line 601 includes the plurality of third signal wiring patterns corresponding to the respective third conductive layers. According to the present second exemplary embodiment, the transmission line 601 includes the four third signal wiring patterns corresponding to the four conductive layers 682 to 685. That is, the transmission line 601 includes the signal wiring patterns 653, 654, 655, and 656 as the plurality of third signal wiring patterns.

According to the present exemplary embodiment, the via conductors 606 and 607 are arranged in parallel. Furthermore, according to the present exemplary embodiment, the section between the via conductors 606 and 607 is connected by the signal wiring patterns 653 to 656. According to this, the capacitance component is increased by the capacitive coupling between the signal wiring patterns 651 to 656. Therefore, the characteristic impedance at the part in the vicinity of the via conductors 606 and 607 is reduced, and the variation width of the characteristic impedance in the transmission line 601 is decreased.

Figure 5A:
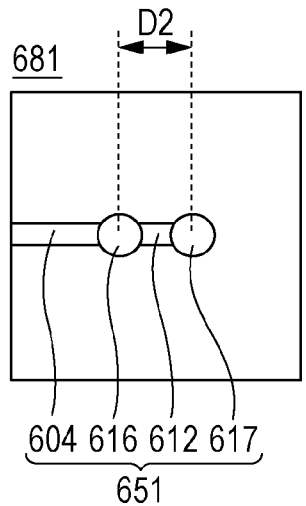
FIGS. 5A to 5F are plan views of respective conductive layers of a printed wiring board according to the second exemplary embodiment.
Figure 5B:
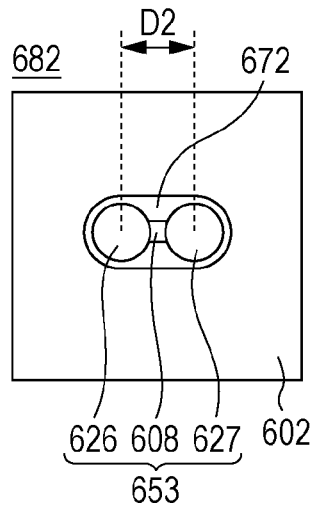
Figure 5C:
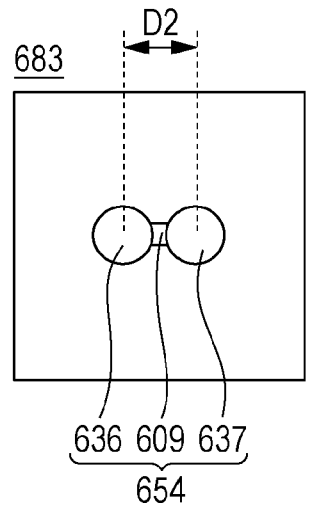
Figure 5D:
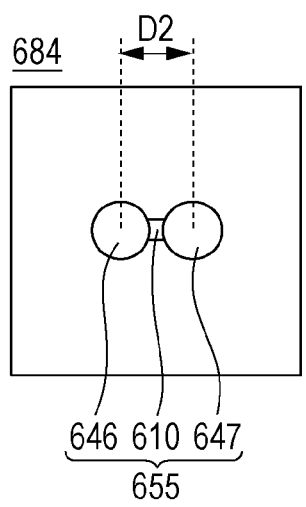
Figure 5E:
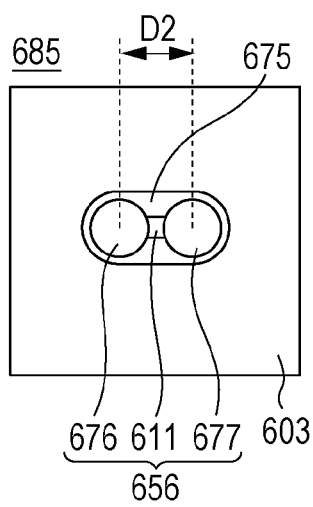
Figure 5F:
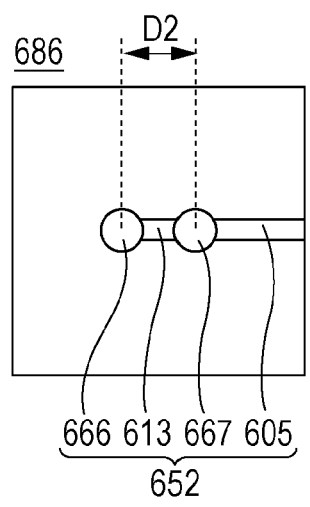

FIG. 5A is a plan view of the conductive layer 681 of the printed wiring board 600 as seen from an arrow X-direction in FIG. 4. FIG. 5B is a plan view of the conductive layer 682 of the printed wiring board 600 as seen from the arrow X-direction in FIG. 4. FIG. 5C is a plan view of the printed wiring board 600 of the conductive layer 683 as seen from the arrow X-direction in FIG. 4. FIG. 5D is a plan view of the conductive layer 684 of the printed wiring board 600 as seen from the arrow X-direction in FIG. 4. FIG. 5E is a plan view of the conductive layer 685 of the printed wiring board 600 as seen from the arrow X-direction in FIG. 4. FIG. 5F is a plan view of the conductive layer 686 of the printed wiring board 600 as seen from the arrow X-direction in FIG. 4.

As illustrated in FIG. 5A, the signal wiring pattern 651 includes a via pad 616 corresponding to a first via pad connected to the via conductor 606 and a via pad 617 corresponding to a second via pad connected to the via conductor 607. The signal wiring pattern 651 also includes a connecting conductor pattern 612 corresponding to a first connecting conductor pattern that connects the via pad 616 to the via pad 617 and a wiring pattern 604 that connects the transmitting circuit 200 to the via pad 616.

As illustrated in FIG. 5F, the signal wiring pattern 652 includes a via pad 666 corresponding to a third via pad connected to the via conductor 606 and a via pad 667 corresponding to a fourth via pad connected to the via conductor 607. The signal wiring pattern 652 also includes a connecting conductor pattern 613 corresponding to a second connecting conductor pattern that connects the via pad 666 to the via pad 667 and a wiring pattern 605 that connects the receiving circuit 300 to the via pad 667.

As illustrated in FIG. 5B, the signal wiring pattern 653 includes a via pad 626 corresponding to a fifth via pad connected to the via conductor 606 and a via pad 627 corresponding to the sixth via pad connected to the via conductor 607. The signal wiring pattern 653 also includes a connecting conductor pattern 608 corresponding to the third connecting conductor pattern that connects the via pad 626 to the via pad 627.

As illustrated in FIG. 5C, the signal wiring pattern 654 includes a via pad 636 corresponding to the fifth via pad connected to the via conductor 606 and a via pad 637 corresponding to the sixth via pad connected to the via conductor 607. The signal wiring pattern 654 also includes a connecting conductor pattern 609 corresponding to the third connecting conductor pattern that connects the via pad 636 to the via pad 637.

As illustrated in FIG. 5D, the signal wiring pattern 655 includes a via pad 646 corresponding to the fifth via pad connected to the via conductor 606 and a via pad 647 corresponding to the sixth via pad connected to the via conductor 607. The signal wiring pattern 655 also includes a connecting conductor pattern 610 corresponding to the third connecting conductor pattern that connects the via pad 646 to the via pad 647.

As illustrated in FIG. 5E, the signal wiring pattern 656 includes a via pad 676 corresponding to the fifth via pad connected to the via conductor 606 and a via pad 677 corresponding to the sixth via pad connected to the via conductor 607. The signal wiring pattern 656 also includes a connecting conductor pattern 611 corresponding to the third connecting conductor pattern that connects the via pad 676 to the via pad 677.

The connecting conductor patterns 608 to 613 are arranged on a same line in a plan view (as seen from the arrow X-direction perpendicular to the mounting surface of the printed wiring board 600). According to this, the capacitance component among the signal wiring patterns 651 to 656 is increased, and it is possible to more effectively reduce the character impedance in the vicinity of the via conductors 606 and 607.

According to the present exemplary embodiment, the connecting conductor patterns 608 to 613 are arranged on a straight line that connects a center P11 of the via conductor 606 to a center P12 of the via conductor 607 as seen from the arrow X-direction. Therefore, the connecting conductor patterns 608 to 613 take a shortest route, and an occupied area of the wirings is small.

It is noted that a clearance hole 672 surrounding the via conductors 606 and 607, the via pads 626 and 627, and the connecting conductor pattern 608 is formed on the ground plane 602 on the conductive layer 682. In addition, a clearance hole 675 surrounding the via conductors 606 and 607, the via pads 676 and 677, and the connecting conductor pattern 611 is formed on the power supply plane 603 on the conductive layer 685.

Simulation Example 5

Hereinafter, specific numeral values are set and analyzed in the printed circuit board 1000 described according to the second exemplary embodiment, and an effect thereof will be described. The sizes of the respective parts of the printed wiring board 600 used in the simulation will be illustrated below.

The thickness of the conductive layers 681 and 686 is set as 0.043 [mm]. The thickness of the conductive layers 682, 683, 684, and 685 is set as 0.035 [mm]. The thickness of the insulating layers 687 and 691 is set as 0.1 [mm]. The thickness of the insulating layers 688 and 690 is set as 0.5 [mm]. The thickness of the insulating layer 689 is set as 0.2 [mm]. A total thickness T2 of the printed wiring board 600 is 1.626 [mm].

The wiring width of the conductor patterns 604, 605, 608, 609, 610, 611, 612, and 613 is set as 0.125 [mm]. The diameter (outer diameter) of the via conductors 606 and 607 is set as 0.3 [mm]. The diameter of the via pads 616, 617, 666, and 667 is set as 0.6 [mm]. The diameter of the via pads 626, 627, 636, 637, 646, 647, 676, and 677 is set as 0.8 [mm]. A via pitch D2 is set as 1.0 [mm]. A length in a longitudinal direction of the clearance holes 672 and 675 is set as 2.0 [mm], and a length in a lateral direction is set as 1.0 [mm]. A smallest gap between the via pads 626 and 627 and the ground plane 602 is set as 0.1 [mm]. A smallest gap between the via pads 676 and 677 and the power supply plane 603 is set as 0.1 [mm].

Since the diameter of the via pads 616 and 617 is 0.6 [mm] and the pitch between the via conductors 606 and 607 is 1.0 [mm], a shortest length of the connecting conductor pattern 612 is 0.4 [mm]. Since the diameter of the via pads 666 and 667 is 0.6 [mm] and the pitch between the via conductors 606 and 607 is 1.0 [mm], a shortest length of the connecting conductor pattern 613 is 0.4 [mm]. Since the diameter of the via pads 626 and 627 is 0.8 [mm] and the pitch between the via conductors 606 and 607 is 1.0 [mm], a shortest length of the connecting conductor pattern 608 is 0.2 [mm]. Since the diameter of the via pads 636 and 637 is 0.8 [mm] and the pitch between the via conductors 606 and 607 is 1.0 [mm], a shortest length of the connecting conductor pattern 609 is 0.2 [mm]. Since the diameter of the via pads 646 and 647 is 0.8 [mm] and the pitch between the via conductors 606 and 607 is 1.0 [mm], a shortest length of the connecting conductor pattern 610 is 0.2 [mm]. Since the diameter of the via pads 676 and 677 is 0.8 [mm] and the pitch between the via conductors 606 and 607 is 1.0 [mm], a shortest length of the connecting conductor pattern 611 is 0.2 [mm]. A relative dielectric constant of the insulating layer is set as 4.3.

A simulation is carried out for measuring a reflectance by the TDR (Time Domain Reflectomery) method of inputting the step pulse having the amplitude $V_r$, and the rising time of 35 [ps] from an end part of the transmitting circuit 200 side of the wiring pattern 604. Subsequently, the characteristic impedance of the transmission line 601 is calculated. When a voltage at a measurement point (end part of the transmitting circuit 200 side of the wiring pattern 604) is set as $V_r$, and an output impedance of the pulse signal is set as 50[Ω], the characteristic impedance Z of the transmission line 601 can be calculated by the above-described expression (2).

Figure 6:
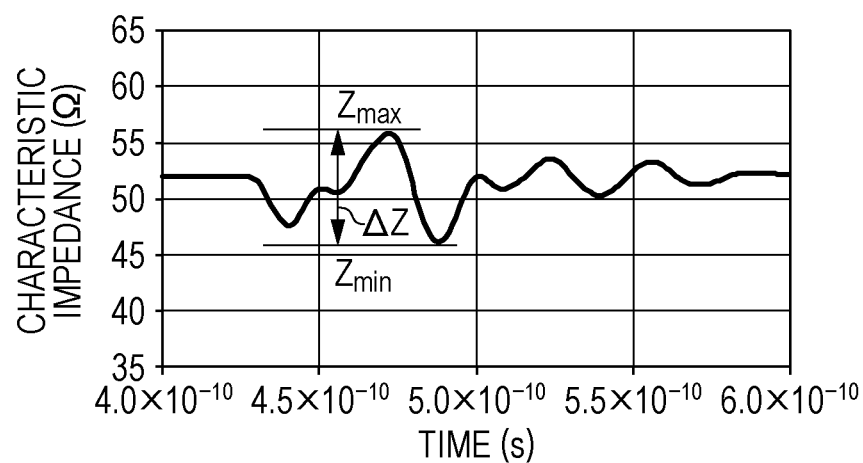
FIG. 6 is a graphic representation of a simulation result in the printed circuit board according to the second exemplary embodiment.

A result of the TDR simulation in the above-described conditions will be illustrated in FIG. 6. The vertical axis represents the characteristic impedance of the transmission line 601, and the horizontal axis represents the time. The central value of the characteristic impedance of the transmission line 601 is 52[Ω]. The maximum value $Z_{max}$ of the characteristic impedance of the transmission line 601 is 55.2[Ω], and the minimum value $Z_{min}$ is 47.6[Ω], so that the difference ΔZ is 7.6 [Ω].

When the minimum value $Z_{min}$ is 47.6[Ω], a maximum displacement from the characteristic impedance of the wiring patterns 604 and 605 at 52[Ω] is 4.4[Ω]. This indicates an improvement as compared with the maximum value 5.2[Ω], the characteristic impedance of the wiring patterns 604 and 605 is further set to be uniform to 52 [Ω]±10 [%].

As described above, according to the present second exemplary embodiment, since the two via conductors 606 and 607 are mutually connected by the signal wiring patterns 653 to 656, the capacitance component in the vicinity of the via conductors 606 and 607 is increased. Therefore, the maximum value of the characteristic impedance in the vicinity of the via conductors 606 and 607 is decreased. According to this, the characteristic impedance of the transmission line 601 is further set to be uniform, and the characteristic impedance mismatching at the part of the via conductors 606 and 607 is suppressed.

Third Exemplary Embodiment

Figure 8:
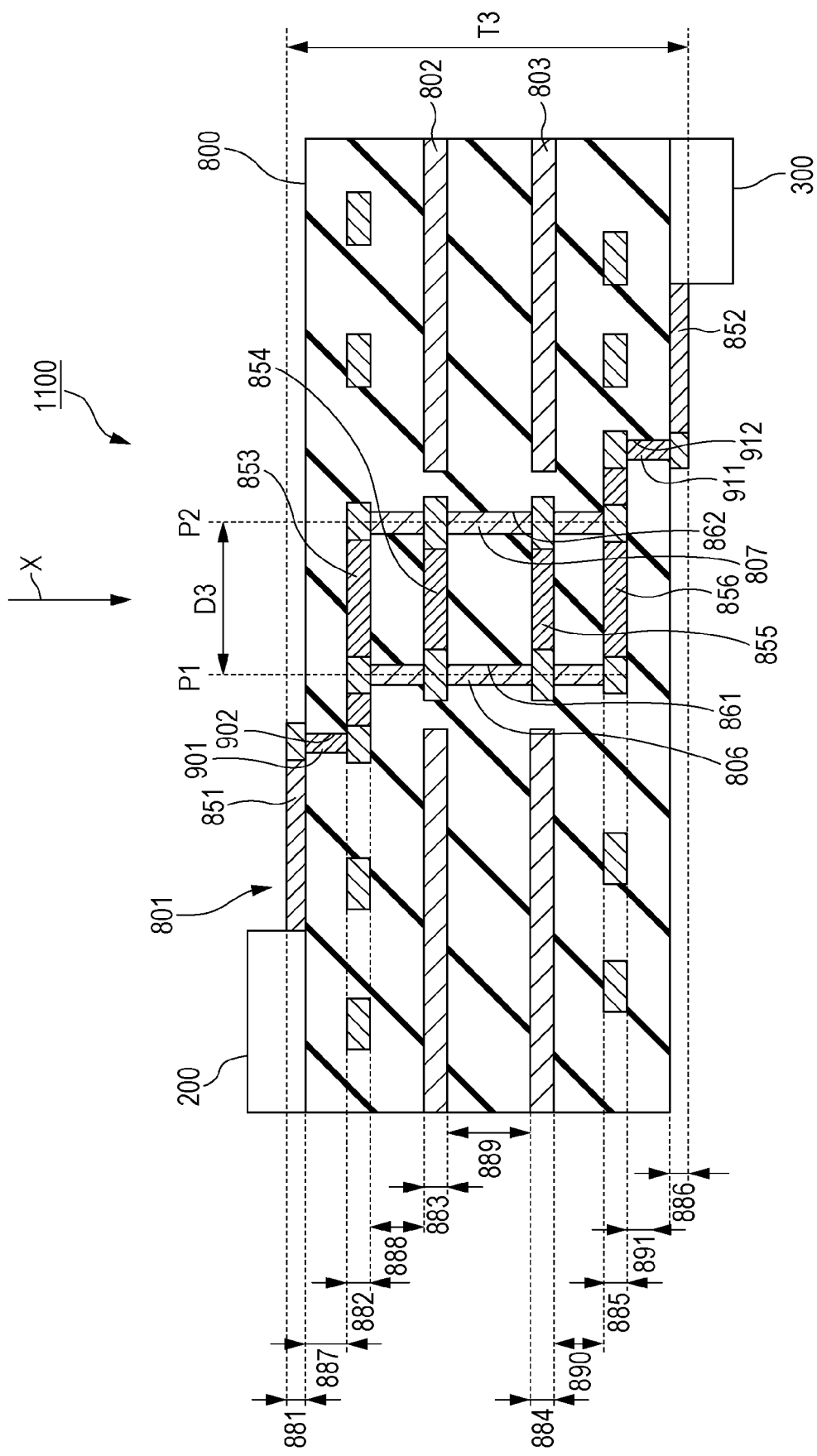
FIG. 8 is a cross sectional view of a printed circuit board according to a third exemplary embodiment.

Next, a printed circuit board the third exemplary embodiment of the present invention will be described. FIG. 8 is a cross sectional view of the printed circuit board according to the third exemplary embodiment of the present invention. In FIG. 8, a cross section of the printed circuit board along a face perpendicular to a plane of the printed wiring board is illustrated. A printed circuit board 1100 includes a printed wiring board 800, the transmitting circuit 200 mounted to the printed wiring board 800, and the receiving circuit 300 mounted to the printed wiring board 800.

The printed wiring board 800 is a substrate including six conductive layers according to the present third exemplary embodiment. Six conductive layers 881, 882, 883, 884, 885, and 886 are laminated and formed via insulating layers 887, 888, 889, 890, and 891. The conductive layers 881 to 886 are sequentially mutually arranged at intervals, and the insulating layers 887 to 891 are arranged between these conductive layers. Insulating materials (dielectrics) are arranged for the respective insulating layers 887 to 891.

According to the present third exemplary embodiment, among a pair of surface layers, the conductive layer 881 corresponding to a first conductive layer is one surface layer (first surface layer), and the conductive layer 886 corresponding to a second conductive layer is the other surface layer (second surface layer) on a side opposite to the one surface layer. The plurality of conductive layers 882 to 885 as third conductive layers corresponding to inner layers are arranged between the pair of conductive layers 881 and 886 via the insulating layers 887 to 891. Specifically, the insulating layer 887 is arranged between the conductive layer 881 and the conductive layer 882. The insulating layer 888 is arranged between the conductive layer 882 and the conductive layer 883. The insulating layer 889 is arranged between the conductive layer 883 and the conductive layer 884. In addition, the insulating layer 890 is arranged between the conductive layer 884 and the conductive layer 885, and the insulating layer 891 is arranged between the conductive layer 885 and the conductive layer 886. Solder resist layers that are not illustrated in the drawing for protecting the conductor patterns may be provided on front faces of the conductive layers 881 and 886 corresponding to the surface layers.

The transmitting circuit 200 and the receiving circuit 300 are constituted, for example, by a semiconductor package. The transmitting circuit 200 is mounted to the conductive layer 881, and the receiving circuit 300 is mounted to the conductive layer 886.

The printed wiring board 800 includes a transmission line 801 that transmits a signal. The signal terminal of the transmitting circuit 200 is connected to one terminal of the transmission line 801, and the signal terminal of the receiving circuit 300 is connected to the other terminal of the transmission line 801. The printed wiring board 800 also includes a ground plane 802 corresponding to a conductor pattern having a plane-like shape which is arranged on the conductive layer 883 and a power supply plane 803 corresponding to a conductor pattern having a plane-like shape which is arranged on the conductive layer 884.

The ground terminal of the transmitting circuit 200 and the ground terminal of the receiving circuit 300 are connected to the ground plane 802 through a via or the like not illustrated in the drawing. In addition, the power supply terminal of the transmitting circuit 200 and the power supply terminal of the receiving circuit 300 are connected to the power supply plane 803 through a via or the like not illustrated in the drawing.

The transmitting circuit 200 transmits a digital signal at a predetermined transmission speed to the transmission line 801 as a signal, and the receiving circuit 300 receives the digital signal transmitted from the transmitting circuit 200 via the transmission line 801.

The transmission line 801 includes a signal wiring pattern 851 corresponding to a first signal wiring pattern arranged on the conductive layer 881 and a signal wiring pattern 852 corresponding to a second signal wiring pattern arranged on the conductive layer 886. The signal wiring patterns 851 and 852 are formed of conductor patterns. The transmitting circuit 200 is connected to the signal wiring pattern 851, and the receiving circuit 300 is connected to the signal wiring pattern 852.

The transmission line 801 also includes a via conductor 806 corresponding to a first via conductor that is formed in a via hole 861 corresponding to a first via hole formed in the printed wiring board 800 and connects a signal wiring pattern 853 to a signal wiring pattern 856. In addition, the transmission line 801 also includes also includes a via conductor 807 corresponding to a second via conductor that is formed in a via hole 862 corresponding to a second via hole formed in the printed wiring board 800 and that connects the signal wiring pattern 853 to the signal wiring pattern 856. The via holes 861 and 862, that is, the via conductors 806 and 807 are arranged so as to be adjacent to each other at an interval. According to the present exemplary embodiment, the via holes 861 and 862 penetrate through the conductive layers 882, 883, 884, and 885 and the insulating layers 888, 889, and 890, and the via conductors 806 and 807 are buried vias that are not opened on the surface of the printed wiring board 800.

The transmission line 801 also includes a via conductor 901 corresponding to a third via conductor that is formed in a via hole 902 corresponding to a third via hole formed in the printed wiring board 800 and connects the signal wiring pattern 851 corresponding to the first signal wiring pattern to the signal wiring pattern 853 corresponding to a third signal wiring pattern. The via hole 902 penetrates through the conductive layer 881 and the insulating layer 887, and the via conductor 901 is a blind via that is opened on the first conductive layer of the printed wiring board 800.

In addition, the transmission line 801 also includes a via conductor 911 corresponding to a fourth via conductor that is formed the via hole 912 corresponding to a fourth via hole in formed in the printed wiring board 800 and connects the signal wiring pattern 856 corresponding to the third signal wiring pattern to the signal wiring pattern 852 corresponding to the second signal wiring pattern. The via hole 912 penetrates through the conductive layer 886 and the insulating layer 891, the via conductor 911 is a blind via that is opened on the second conductive layer of the printed wiring board 800.

The transmission line 801 further includes a signal wiring pattern 854 corresponding to a third signal wiring pattern that is arranged on the conductive layer 883 and connects the via conductor 806 to the via conductor 807. Furthermore, the transmission line 801 includes a signal wiring pattern 855 corresponding to the third signal wiring pattern that is arranged on the conductive layer 884 and connects the via conductor 806 to the via conductor 807.

In this manner, the transmission line 801 includes the plurality of third signal wiring patterns corresponding to the third conductive layers. According to the present third exemplary embodiment, the transmission line 801 includes four third signal wiring patterns corresponding to the four conductive layers 883 to 884. That is, the transmission line 801 includes the signal wiring pattern 853, 854, 855, and 856 as the plurality of third signal wiring patterns.

According to the present exemplary embodiment, the via conductors 806 and 807 are arranged in parallel. Furthermore, according to the present exemplary embodiment, the section between the via conductors 806 and 807 is connected by the signal wiring patterns 853 to 856. According to this, the capacitance component is increased by the capacitive coupling between the signal wiring patterns 851 to 856. Therefore, the characteristic impedance in the vicinity of the via conductors 806 and 807 is reduced, and the variation width of the characteristic impedance in the transmission line 801 is decreased.

Figure 9A:
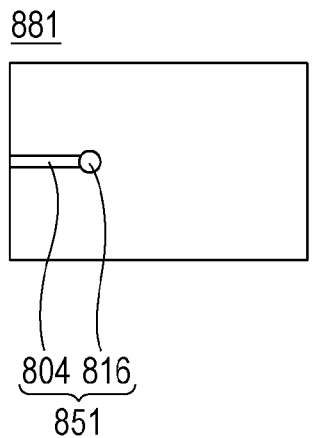
FIGS. 9A to 9F are plan views of respective conductive layers of a printed wiring board according to the third exemplary embodiment.
Figure 9B:
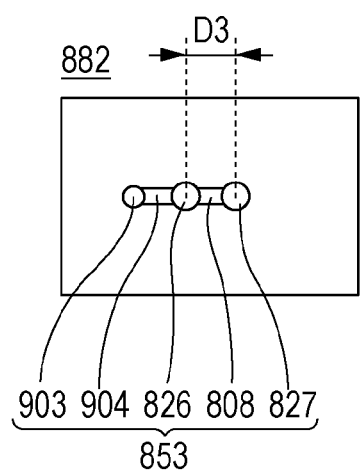
Figure 9C:
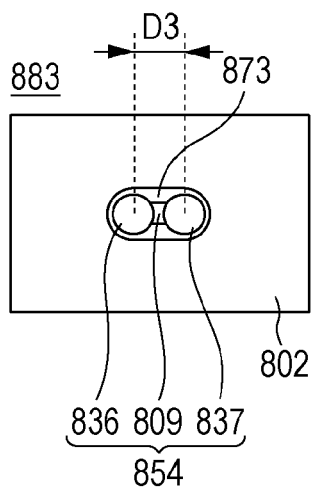
Figure 9D:
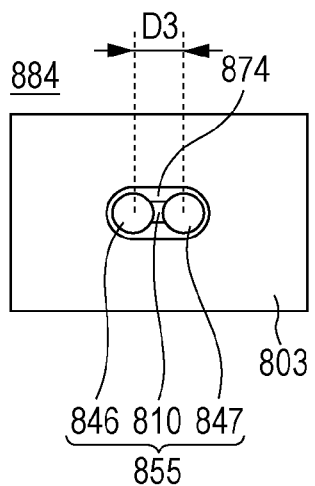
Figure 9E:
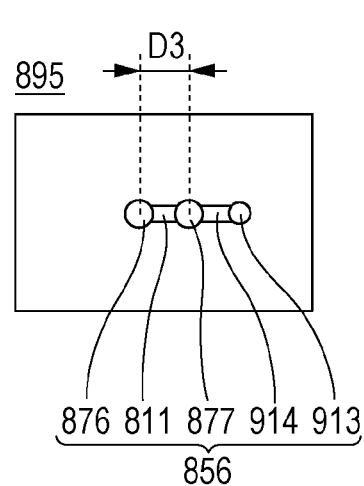
Figure 9F:
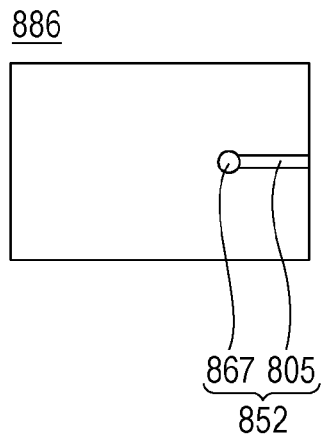

FIG. 9A is a plan view of the conductive layer 881 of the printed wiring board 800 as seen from an arrow X-direction in FIG. 8. FIG. 9B is a plan view of the conductive layer 882 of the printed wiring board 800 as seen from the arrow X-direction in FIG. 8. FIG. 9C is a plan view of the conductive layer 883 of the printed wiring board 800 as seen from the arrow X-direction in FIG. 8. FIG. 9D is a plan view of the conductive layer 884 of the printed wiring board 800 as seen from the arrow X-direction in FIG. 8. FIG. 9E is a plan view of the conductive layer 885 of the printed wiring board 800 as seen from the arrow X-direction in FIG. 8. FIG. 9F is a plan view of the conductive layer 886 of the printed wiring board 800 as seen from the arrow X-direction in FIG. 8.

As illustrated in FIG. 9A, the signal wiring pattern 851 includes a via pad 816 connected to the via conductor 901. The signal wiring pattern 851 also includes a wiring pattern 804 that connects the transmitting circuit 200 to the via pad 816.

As illustrated in FIG. 9F, the signal wiring pattern 852 includes the via conductor 911 connected to a via pad 867.

The signal wiring pattern 852 also includes a wiring pattern 805 that connects the receiving circuit 300 to the via pad 867.

As illustrated in FIG. 9B, the signal wiring pattern 853 includes a via pad 903 connected to the via conductor 901, a via pad 826 connected to the via conductor 806, and a via pad 827 connected to the via conductor 807. The signal wiring pattern 853 also includes a connecting conductor pattern 904 that connects the via pad 903 to the via pad 826 and a connecting conductor pattern 808 that connects the via pad 826 to the via pad 827.

As illustrated in FIG. 9C, the signal wiring pattern 854 includes a via pad 836 connected to the via conductor 806 and a via pad 837 connected to the via conductor 807. The signal wiring pattern 854 also includes a connecting conductor pattern 809 that connects the via pad 836 to the via pad 837.

As illustrated in FIG. 9D, the signal wiring pattern 855 includes a via pad 846 connected to the via conductor 806 and a via pad 847 connected to the via conductor 807. The signal wiring pattern 855 also includes a connecting conductor pattern 810 that connects the via pad 846 to the via pad 847.

As illustrated in FIG. 9E, the signal wiring pattern 856 includes a via pad 876 connected to the via conductor 806, a via pad 877 connected to the via conductor 807, and a via pad 913 connected to the via conductor 911. The signal wiring pattern 856 also includes a connecting conductor pattern 811 that connects the via pad 876 to the via pad 877 and a connecting conductor pattern 914 that connects the via pad 877 to the via pad 913.

The connecting conductor patterns 808 to 811 are arranged on a same line in a plan view (as seen from the arrow X-direction perpendicular to the mounting surface of the printed wiring board 800). According to this, the capacitance component among the signal wiring patterns 851 to 856 is increased, and it is possible to more effectively reduce the character impedance in the vicinity of the via conductors 806 and 807.

According to the present exemplary embodiment, the connecting conductor patterns 808 to 811 are arranged on a straight line that connects the center P11 of the via conductor 806 to the center P12 of the via conductor 807 as seen from the arrow X-direction. Therefore, the connecting conductor patterns 808 to 811 take a shortest route, and an occupied area of the wirings is small.

It is noted that a clearance hole 873 surrounding the via conductors 806 and 807, the via pads 836 and 837, and the connecting conductor pattern 809 is formed on the ground plane 802 on the conductive layer 883. In addition, a clearance hole 874 surrounding the via conductors 806 and 807, the via pads 846 and 847, and the connecting conductor pattern 810 is formed on the power supply plane 803 on the conductive layer 884.

It is noted that the present invention is not limited to the above-described exemplary embodiments, and a large number of modifications can be made by those skilled in the art within the technical concept of the present invention.

According to the above-described first, second, and third exemplary embodiments, the plurality of third signal wiring patterns are preferably used, but a part of the third signal wiring patterns may be omitted, and only the single third signal wiring pattern may also be used.

The third conductive layer on which the third signal wiring pattern is arranged is preferably adjacent to at least one of the first conductive layer and the second conductive layer via the insulating layer. To elaborate, at least one of the third signal wiring patterns is preferably adjacent to at least one of the first signal wiring pattern and the second signal wiring pattern via the insulating layer. According to this, the capacitance component based on the capacitive coupling between the first signal wiring pattern and the third signal wiring pattern is increased, and it is possible to more effectively decrease the variation width of the characteristic impedance. It is noted that according to the above-described first exemplary embodiment, the signal wiring pattern 153 is adjacent to the signal wiring pattern 151 via the insulating layer 185, and the signal wiring pattern 154 is adjacent to the signal wiring pattern 152 via the insulating layer 187. According to this, it is possible to effectively decrease the variation width of the characteristic impedance because of the increase in the capacitance component between the signal wiring patterns 151 and 153 and the capacitance component between the signal wiring patterns 152 and 154. According to the second above-described exemplary embodiment, the signal wiring pattern 653 is adjacent to the signal wiring pattern 651 via the insulating layer 687, and the signal wiring pattern 656 is adjacent to the signal wiring pattern 652 via the insulating layer 691. According to this, it is possible to effectively decrease the variation width of the characteristic impedance because of the capacitance component between the signal wiring patterns 651 and 653 and the capacitance component between the signal wiring patterns 652 and 656.

In a case where the plurality of third conductive layers on which the third signal wiring patterns are arranged exist, among the plurality of third conductive layers, the two third conductive layers are preferably adjacent to each other via the insulating layer. To elaborate, the two third signal wiring patterns are preferably mutually adjacent via the insulating layer. According to this, the capacitance component based on the capacitive coupling between the third signal wiring patterns is increased, and it is possible to more effectively decrease the variation width of the characteristic impedance. It is noted that according to the above-described first exemplary embodiment, the signal wiring pattern 153 and the signal wiring pattern 154 are mutually adjacent via the insulating layer 186. According to this, it is possible to effectively decrease the variation width of the characteristic impedance because of the increase in the capacitance component between the signal wiring patterns 153 and 154. According to the above-described the second exemplary embodiment, the signal wiring pattern 653 and the signal wiring pattern 654 are mutually adjacent via the insulating layer 688. The signal wiring pattern 654 and the signal wiring pattern 655 are mutually adjacent via the insulating layer 689. Furthermore, the signal wiring pattern 655 and the signal wiring pattern 656 are mutually adjacent via the insulating layer 690. According to this, it is possible to effectively decrease the variation width of the characteristic impedance because of the increase the capacitance component between the signal wiring patterns 653 and 654, the capacitance component between the signal wiring patterns 654 and 655, and the capacitance component between the signal wiring patterns 655 and 656. In addition, according to the above-described third exemplary embodiment, the signal wiring pattern 853 and the signal wiring pattern 854 are mutually adjacent via the insulating layer 888. The signal wiring pattern 854 and the signal wiring pattern 855 are mutually adjacent via the insulating layer 889. Furthermore, the signal wiring pattern 855 and the signal wiring pattern 856 are mutually adjacent via the insulating layer 890. According to this, it is possible to effectively decrease the variation width of the characteristic impedance because of the increase in the capacitance component between the signal wiring patterns 853 and 854, the capacitance component between the signal wiring patterns 854 and 855, and the capacitance component between the signal wiring patterns 855 and 856.

The cases have been described in which the printed wiring board includes the four layers of the conductive layers according to the first exemplary embodiment and the printed wiring board includes the six layers of the conductive layers according to the second and third exemplary embodiments, but the present invention can be employed if the printed wiring board includes three or more layers of the conductive layers. To elaborate, the case has been described in which the plurality of third conductive layers are arranged between the first conductive layer and the second conductive layer, the present invention can be employed even in a case where the single third conductive layer is arranged.

According to the above-described first, second, and third exemplary embodiments, the case has been described in which the first signal wiring pattern is arranged on one of the surface layers, but the present invention can also be employed in a case where the first signal wiring pattern is arranged on an inner layer. Similarly, the case has been described in which the second signal wiring pattern is arranged on the other surface layer, but the present invention can be employed in a case where the second signal wiring pattern is arranged on an inner layer.

According to the above-described first, second, and third exemplary embodiments, the case has been described in which the transmitting circuit 200 is mounted to one of the surface layers, the receiving circuit 300 is mounted to the other surface layers, and the transmission line is arranged over both the surface layers via the via conductor, but the configuration is not limited to this. The present invention can be employed even in a case where the transmitting circuit 200 and the receiving circuit 300 are mounted to one of the pair of surface layers if the transmission line is arranged via the via conductor.

According to the above-described first and second exemplary embodiments, the case has been described in which the respective connecting conductor patterns are arranged on the same line in a plan view, but the configuration is not limited to this. Although the degree of the increase in the capacitance component in the vicinity of the via conductor is decreased, the respective connecting conductor patterns may be arranged while being shifted in a plan view, and in this case too, the effect of the increase in the capacitance component can be attained, and the variation width of the characteristic impedance is decreased.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-084540, filed Apr. 15, 2013 and Japanese Patent Application No. 2014-040405, filed Mar. 3, 2014 which are hereby incorporated by reference herein in their entirety.

What is claimed is:

1. A printed wiring board comprising:
a first via conductor and a second via conductor arranged relative to, and adjacent to, each other;
a first conductive layer on which a first signal wiring pattern having a first connecting conductor pattern is arranged;
a second conductive layer on which a second signal wiring pattern having a second connecting conductor pattern is arranged, wherein the first via conductor and the second via conductor connect the first signal wiring pattern to the second signal wiring pattern;
a third conductive layer on which a third signal wiring pattern having a third connecting conductor pattern is arranged, wherein the third connecting conductor pattern is connected to the first via conductor and the second via conductor, and wherein the third conductive layer is arranged between the first conductive layer and the second conductive layer via an insulating layer; and
a signal transmission line that includes the first via conductor, the second via conductor, the first signal wiring pattern, the second signal wiring pattern, and the third signal wiring pattern.

2. The printed wiring board according to claim 1, wherein the first signal wiring pattern includes a first via pad connected to the first via conductor and a second via pad connected to the second via conductor, wherein the first connecting conductor pattern connects the first via pad to the second via pad,
wherein the second signal wiring pattern includes a third via pad connected to the first via conductor, and a fourth via pad connected to the second via conductor, wherein the second connecting conductor pattern connects the third via pad to the fourth via pad, and
wherein the third signal wiring pattern includes a fifth via pad connected to the first via conductor and a sixth via pad connected to the second via conductor, wherein the third connecting conductor pattern connects the fifth via pad to the sixth via pad.

3. The printed wiring board according to claim 2, wherein the first connecting conductor pattern, the second connecting conductor pattern, and the third connecting conductor pattern are arranged on a same line in a plan view as viewed from a direction perpendicular to a mounting surface of the printed wiring board.

4. The printed wiring board according to claim 2, wherein a wiring width of the third connecting conductor pattern is greater than or equal to a diameter of the first via conductor and the second via conductor and also less than or equal to a diameter of the fifth via pad and the sixth via pad.

5. The printed wiring board according to claim 2,
wherein a wiring width of the first connecting conductor pattern is greater than or equal to a diameter of the first via conductor and the second via conductor and also is less than or equal to a diameter of the first via pad and the second via pad, and
wherein a wiring width of the second connecting conductor pattern is greater than or equal to a diameter of the first via conductor and the second via conductor and also is less than or equal to a diameter of the third via pad and the fourth via pad.

6. The printed wiring board according to claim 1, wherein a plurality of third conductive layers are arranged between the first conductive layer and the second conductive layer via the insulating layer, and third signal wiring patterns are arranged so as to correspond to respective third conductive layers.

7. The printed wiring board according to claim 1, wherein a pitch between the first via conductor and the second via conductor is less than or equal to a thickness from the first conductive layer to the second conductive layer.

8. The printed wiring board according to claim 1, wherein, among a pair of surface layers, the first conductive layer is one surface layer, and the second conductive layer is the other surface layer.

9. The printed wiring board according to claim 1, wherein the first conductive layer and the second conductive layer are inner layers of the printed wiring board, and the first conductive layer is connected to one surface layer among a pair of surface layers via a third via conductor, and the second conductive layer is connected to the other surface layer via a fourth via conductor.

10. A printed circuit board comprising:
the printed wiring board according to claim 1;
a transmitting circuit that is mounted on the printed wiring board and configured to transmit a signal; and
a receiving circuit that is mounted on the printed wiring board and configured to receive the signal transmitted by the transmitting circuit.

11. The printed wiring board according to claim 1, wherein the third connecting conductor pattern is positioned in between the first connecting conductor pattern and the second connecting conductor pattern to suppress impedance mismatch of the signal transmission line.

12. The printed wiring board according to claim 1, wherein the third connecting conductor pattern is positioned in line with the first connecting conductor pattern and the second connecting conductor pattern to suppress impedance mismatch of the signal transmission line.

13. The printed wiring board according to claim 1, wherein the third connecting conductor pattern is positioned relative the first connecting conductor pattern and the second connecting conductor pattern to cause capacitive coupling between the first signal wiring pattern, the second signal wiring pattern, and the third signal wiring pattern to suppress impedance mismatch of the signal transmission line.

14. The printed wiring board according to claim 1, wherein the first via conductor and the second via conductor arranged in parallel and at an interval relative to each other.

15. The printed wiring board according to claim 1, wherein the third connecting conductor pattern connects the first via conductor to the second via conductor.

16. The printed wiring board according to claim 1, wherein the first connecting conductor pattern, the second connecting conductor pattern, and the third connecting conductor pattern connect the first via conductor to the second via conductor, each along a shortest route between the first via conductor to the second via conductor.

17. An electronic equipment comprising the printed wiring board according to claim 1.

* * * * *